United States Patent
Abe et al.

[11] Patent Number: 5,988,707
[45] Date of Patent: Nov. 23, 1999

[54] SEMICONDUCTOR DEVICE OF LEAD-ON-CHIP STRUCTURE

[75] Inventors: Masaaki Abe; Yukihiro Tsuji, both of Kumamoto, Japan

[73] Assignee: NEC Corporation, Tokyo, Japan

[21] Appl. No.: 08/946,790

[22] Filed: Oct. 8, 1997

[30] Foreign Application Priority Data

Oct. 9, 1996 [JP] Japan .................................. 8-268367

[51] Int. Cl.⁶ .................................................. H01L 23/495
[52] U.S. Cl. ........................................... 287/666; 257/676
[58] Field of Search .............................. 257/66, 783, 676, 257/787, 776

[56] References Cited

U.S. PATENT DOCUMENTS

| | | |
|---|---|---|
| 4,862,245 | 8/1989 | Pashby et al. . |
| 5,177,591 | 1/1993 | Emanuel .................. 257/666 |
| 5,202,577 | 4/1993 | Ichigi et al. ............... 257/666 |
| 5,359,222 | 10/1994 | Okutomo et al. .......... 257/666 |
| 5,539,250 | 7/1996 | Kitano et al. ............. 257/666 |
| 5,796,158 | 8/1998 | King . |
| 5,834,830 | 11/1998 | Cho . |
| 5,834,831 | 11/1998 | Kubota et al. . |

FOREIGN PATENT DOCUMENTS 5-29528 2/1993 Japan .

*Primary Examiner*—Sheila V. Clark
*Attorney, Agent, or Firm*—Young & Thompson

[57] ABSTRACT

In a semiconductor device of a lead-on-chip structure, each of inner leads has a lower surface in direct contact with a principal surface of a semiconductor chip in a wiring bonding region, and the lower surface of each inner lead has a recess formed at a place different from the wiring bonding region. An adhesive double coated tape is accommodated in the recess of each inner lead for sticking the inner leads to the principal surface of the semiconductor chip. Each of bonding wires has one end connected to a corresponding electrode pad on the principal surface of the semiconductor chip and the other end connected to an upper surface of a corresponding inner lead within the wire bonding area.

7 Claims, 5 Drawing Sheets

LSI PACKAGE 10

SEMICONDUCTOR DEVICE OF LEAD-ON-CHIP STRUCTURE

BACKGROUND OF THE INVENTION

1. Field of the Invention

The present invention relates to a semiconductor device, and more specifically, to a semiconductor device having a lead-on-chip structure.

2. Description of Related Art

A semiconductor device having a lead-on-chip structure (called a "LOC structure" hereinafter) generally has an inner lead stuck through an adhesive tape on a semiconductor chip, as disclosed in Japanese Patent Application Pre-examination Publication No. JP-A-5-029528, the content of which is incorporated by reference in its entirety into this application (an English abstract of JP-A-5-029528 is available from the Japanese Patent Office, and the content of the English abstract of JP-A-5-029528 is also incorporated by reference in its entirety into this application).

Referring to FIG. 1, there is shown a partially broken, diagrammatic perspective view of the prior art LOC structure semiconductor device disclosed by JP-A-5-029528. FIG. 2 is an enlarged diagrammatic partial sectional view of the prior art LOC structure semiconductor device shown in FIG. 1 and also shown in JP-A-5-029528. FIG. 3A is a further enlarged diagramrnatic partial sectional view of the prior art LOC structure semiconductor device shown in FIG. 1, showing an inner lead stuck on a semiconductor chip, and FIG. 3B is an enlarged diagrammatic partial plan view of the prior art LOC structure semiconductor device shown in FIG. 1, showing an inner lead stuck on a semiconductor chip in a portion shown in FIG. 3A.

The shown LSI packaae is generally designated with Reference Numeral 10, and includes a package body 12 formed of an epoxy resin. In the epoxy resin package body 12, a semiconductor chip 14 is encapsulated. A principal surface 14A of this semiconductor chip 14 is stuck to an insulative adhesive tape 16 to a lower surface of inner leads 18 which are integral with corresponding outer leads 20 (lead frame) extending outwardly from the package body 12- Each inner lead 18 is connected through a bonding wire 22 to a corresponding electrode pad 24 of the semiconductor chip 14. The adhesive tape 16 is constituted of a so called "pressure sensitive adhesive double coated tape". More specifically, the adhesive tape 16 is a polyimide double coated tape, which is as relatively thick as for example 0.1 mm, since the adhesive tape 16 has not only a function of sticking the inner leads to the semiconductor chip but also a function of fixing the inner leads relative to one another in the lead frame before the inner leads are stuck to the semiconductor chip.

In the above mentioned prior art LOC structure semiconductor device, since the adhesive tape 16 exists between the principal surface of the semiconductor chip 14 and a wire bonding portion of each inner lead, the wire bonding portion of each inner lead does not directly contact with the principal surface of the semiconductor chip 14, and on the other hand, the relatively thick adhesive tape 16 acts as a buffer member. When the bonding wire is bonding to the wire bonding portion of the inner lead, a heat and/or an ultrasonic wave applied for the wiling bonding is difficult to conduct or transfer, with the result that the bonding property of the bonding wire to the inner lead is often not satisfactory.

SUMMARY OF THE INVENTION

Accordingly, it is an object of the present invention to provide a LOC structure semiconductor device which has overcome the above mentioned defect of the conventional one.

Another object of the present invention is to provide a LOC structure semiconductor device having a satisfactory elevated bonding property of the bonding wire to the inner lead.

The above and other objects of the present invention are achieved in accordance with the present invention by a semiconductor device of a lead-on-chip structure, comprising:

- a semiconductor chip having a principal surface and a plurality of electrode pads provided on the principal surface;
- a plurality of inner leads having a lower surface in direct contact with the principal surface of the semiconductor chip in a wiring bonding region, the lower surface of each inner lead having a recess formed at a place different from the wiring bonding region;
- an adhesive double coated tape accommodated in the recess of each inner lead having an upper surface stuck to a bottom of the recess of each inner lead and a lower surface stuck to the principal surface of the semiconductor chip, for sticking the inner leads to the principal surface of the semiconductor chip; and
- a plurality of bonding wires each having one end connected to a corresponding electrode pad on the principal surface of the semiconductor chip and the other end connected to an upper surface of a corresponding inner lead within the wire bonding area.

In one embodiment, the recess of each inner lead has a depth substantially corresponding to a half of a thickness of the inner lead. In addition, the recess of each inner lead has a depth substantially corresponding to a thickness of the adhesive double coated tape.

Specifically, the adhesive double coated tape extends across each of the inner leads in a direction perpendicular to the inner lead so that the adhesive double coated tape is not only accommodated in the recess of each inner lead but also exists on the principal surface of the semiconductor chip between each pair of adjacent inner leads.

According to another aspect of the present invention, there is provided a semiconductor device of a lead-on-chip structure, comprising:

- a semiconductor chip having a principal surface and a plurality of electrode pads provided on the principal surface;
- a plurality of inner leads having a lower surface stuck on the principal surface of the semiconductor chip in at least a wiring bonding region through an extremely thin layer which is stuck to the lower surface of each inner lead and the principal surface of the semiconductor chip and which transmits a bonding energy for a wiring bonding with no substantial loss;
- an insulative adhesive agent filled in a space on the principal surface of the semiconductor chip between each pair of adjacent inner leads; and
- a plurality of bonding wires each having one end connected to a corresponding electrode pad on the principal surface of the semiconductor chip and the other end connected to an upper surface of a corresponding inner lead within the wire bonding area.

For example, the extremely thin layer is formed of a resin layer which has a modulus of elasticity sufficiently lower than the conventional pressure sensitive adhesive double coated tape such as the polyimide double coated tape and which also has a necessary degree of adhesive property with a thickness sufficiently thinner than that of the conventional pressure sensitive adhesive double coated tape. Preferably, the extremely thin layer has a thickness in the range of 5 μm to 30 μm, and can be formed of for example an epoxy resin.

In one embodiment, the extremely thin layer extends on the principal surface of the semiconductor chip across each of the inner leads in a direction perpendicular to the inner lead so that the extremely thin layer exists not only under each inner lead but also exists on the principal surface of the semiconductor chip between each pair of adjacent inner leads.

The above and other objects, features and advantages of the present invention will be apparent from the following description of preferred embodiments of the invention with reference to the accompanying drawings.

DESCRIPTION OF THE PREFERRED EMBODIMENTS

Figure 1:
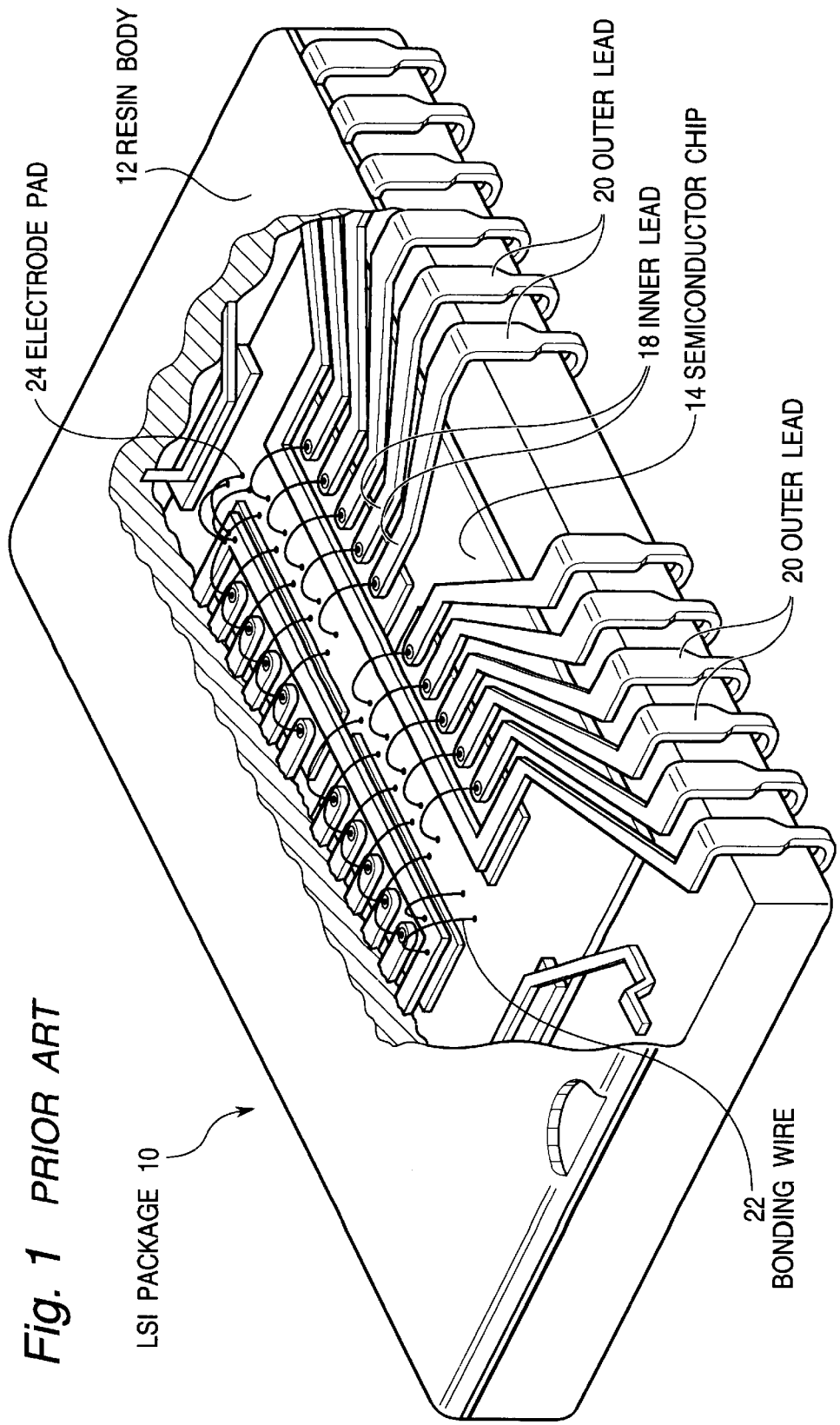
FIG. 1 is a partially broken, diagrammatic perspective view of one example of the prior art LOC structure semiconductor device.
Figure 2:
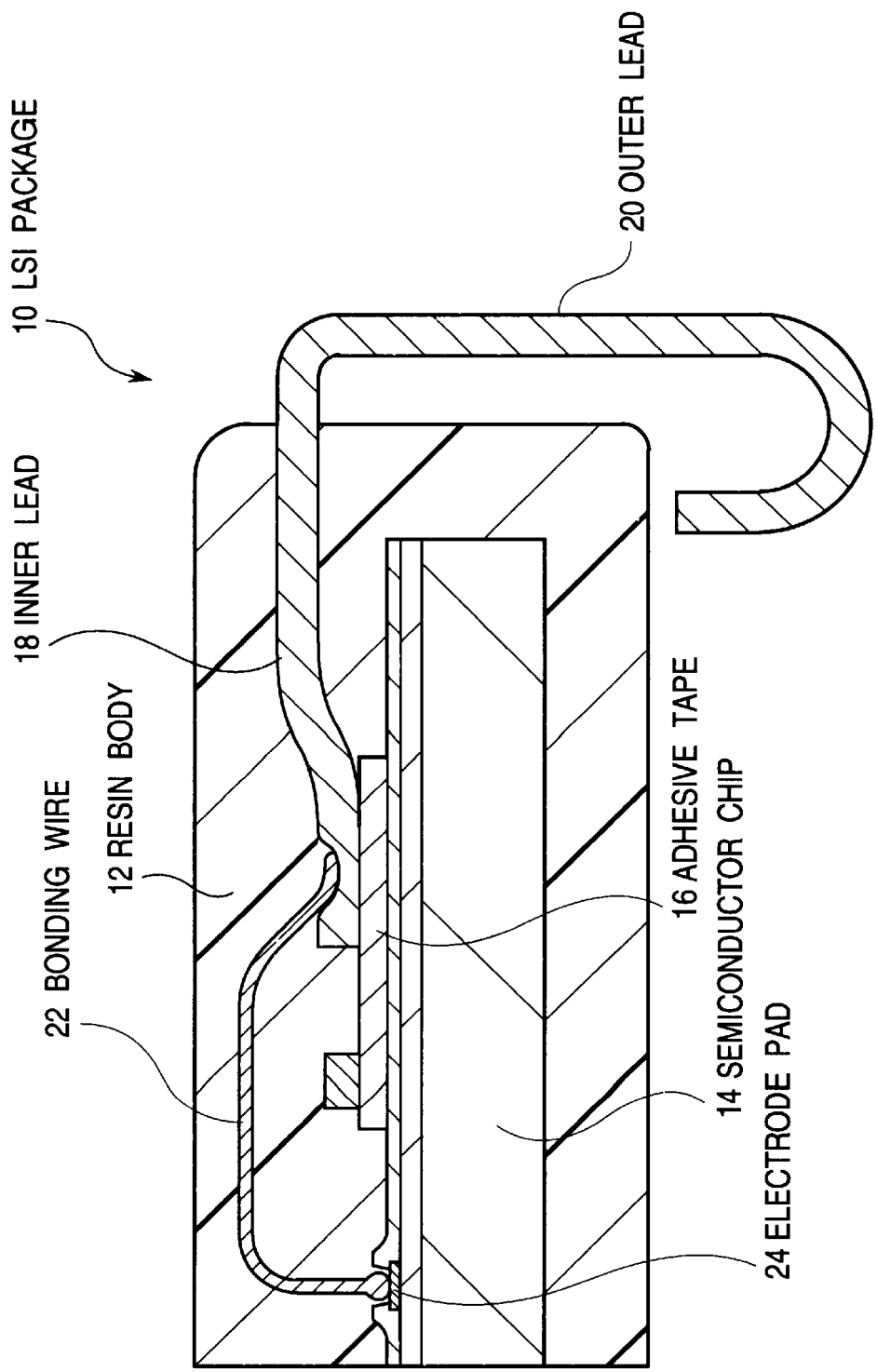
FIG. 2 is an enlarged diagrammatic partial sectional view of the prior art LOC structure semiconductor device shown in FIG. 1, for showing an inner lead stuck on a semiconductor chip.
Figure 3A:
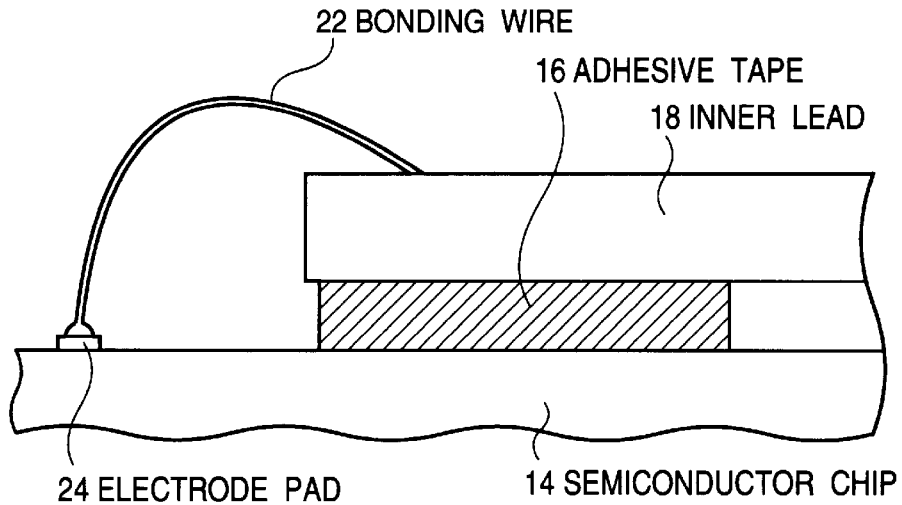
FIG. 3A is a firther enlarged diagrammatic partial sectional view of the prior art LOC structure semiconductor device shown in FIG. 1, for showing an inner lead stuck on a semiconductor chip.
Figure 3B:
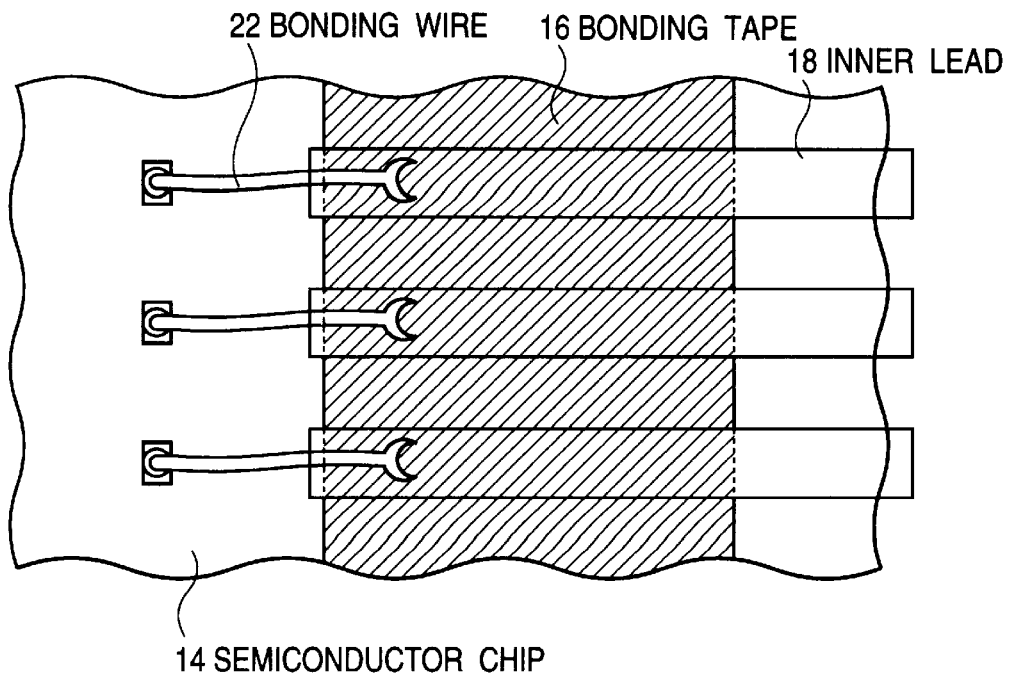
FIG. 3B is an enlarged diagrammatic partial plan view of the prior art LOC structure semiconductor device shown in FIG. 1, for showing an inner lead stuck on a semiconductor chip in a portion shown in FIG. 3A.
Figure 4A:
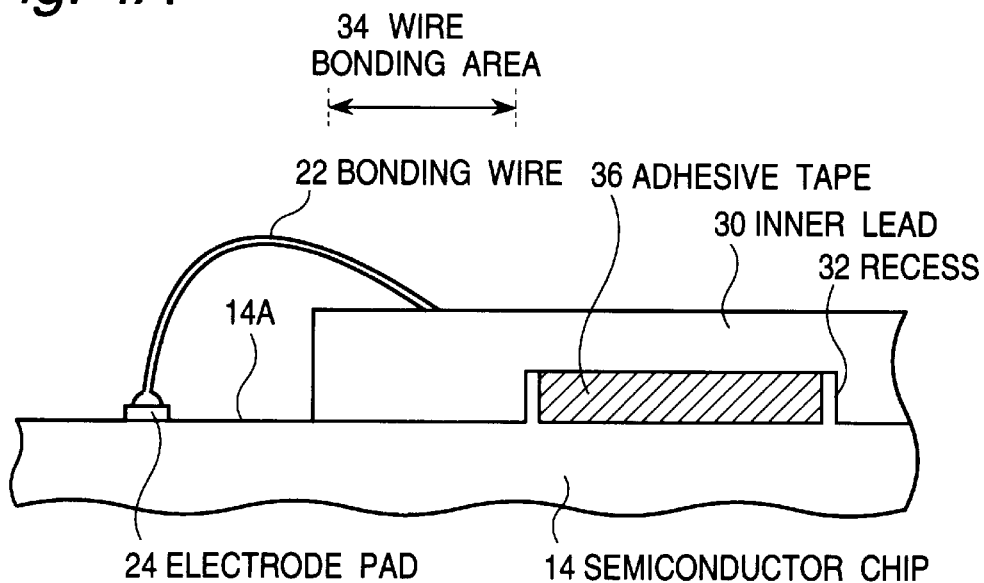
FIG. 4A is a view similar to that of FIG. 3A, but showing a first embodiment of the LOC structure semiconductor device in accordance with the present invention.
Figure 4B:
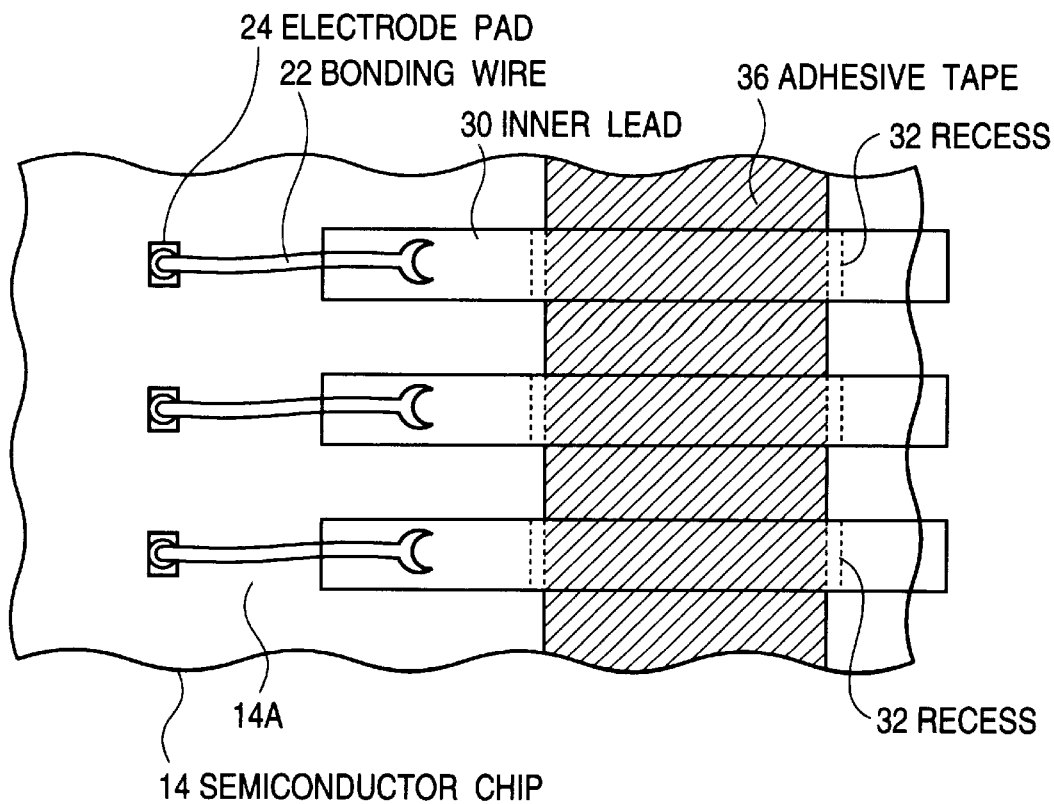
FIG. 4B is a view similar to that of FIG. 3B, but showing the first embodiment of the LOC structure semiconductor device in accordance with the present invention shown in FIG. 4A.

Referring to FIG. 4A, there is shown an enlarged diagrammatic partial sectional view of a first embodiment of the LOC structure semiconductor device in accordance with the present invention, for showing how an inner lead is stuck on a semiconductor chip. FIG. 4B is an enlarged diagrammatic partial plan view of the LOC structure semiconductor device shown in FIG. 4A, showing a portion corresponding to a portion shown in FIG. 4A- In these figures, elements corresponding to those shown in FIGS. 3A and 3B are given the same Reference Numerals.

The shown first embodiment of the LOC structure semiconductor device in accordance with the present invention, comprises a semiconductor chip 14, a plurality of inner leads 30 each of which constitutes a portion of a lead frame and each of which has a recess 32 formed on a lower surface thereof at a position adjacent to a wiring bonding region 34 of the inner lead or separated from the wiring bonding region 34 by some distance, a pressure sensitive adhesive double coated tape 36 accommodated in the recess 32 of the inner leads 30, for sticking the inner leads 30 to a principal surface 14A of the semiconductor chip 14, and a plurality of bonding wires 22 each having one end connected to a corresponding electrode pad 24 on the principal surface 14A of the semiconductor chip 14 by a wiring bonding technology and the other end connected to an upper surface of a corresponding inner lead 30 within the wire bonding area 34 also by the wiring bonding technology. This wire bonding area 34 corresponds to a silver plated area for a wire bonding.

In this embodiment, the recess 32 can be formed on the lower surface of the inner lead 30 by an etching so that a depth of the recess 32 becomes a half of the thickness of the inner lead. In addition, the recess 32 of the inner lead 30 has a depth substantially corresponding to a thickness of the adhesive tape 32.

As shown in FIG. 4B, since the adhesive double coated tape 36 extends over the principal surface 14A of the semiconductor chip 14 across each of the inner leads 30 in a direction perpendicular to the inner lead, the adhesive double coated tape 36 is not only accommodated in the recess 32 of each inner lead 30 but also exists on the principal surface 14A of the semiconductor chip 14 between each pair of adjacent inner leads 30. However, the adhesive double tape 36 does not exist between a lower surface of the inner lead 32 and the principal surface 14A of the semiconductor chip 14 in the wire bonding area 34.

The above mentioned semiconductor device can be formed as follows: The recess 32 is previously formed on the lower surface of each inner lead 30 of a lead frame, and the adhesive double coated tape 36 is applied in the recess 32 of each inner lead 30 of the lead frame, to extend across each of the inner leads 30 in a direction perpendicular to the inner lead. In this condition, similarly to the adhesive tape 16 of the prior art shown in FIGS. 1 to 3B, since the adhesive double coated tape 36 has not only a function of sticking the inner leads to the semiconductor chip but also a function of fixing the inner leads relative to one another in the lead frame before the inner leads are stuck to the semiconductor chip, and therefore, the adhesive double coated tape 36 is required to have a substantial thickness similarly to the adhesive tape 16. Thereafter, the lead frame thus prepared is stuck on the principal surface 14A of the semiconductor chip 14 in such a manner that the adhesive double coated tape 36 is stuck on the principal surface 14A of the semiconductor chip 14.

In the above mentioned first embodiment, the inner lead 32 is stuck on the principal surface 14A of the semiconductor chip 14 by action of the adhesive double coated tape 36 accommodated in the recess 32 of the inner lead 30, and on the other hand, in the wire bonding area 34, the lower surface of the inner lead 32 is in direct contact with the principal surface 14A of the semiconductor chip 14. Therefore, when the bonding wire 22 is bonded to an upper surface of the inner lead 30 in the wire bonding area 34, a heat and/or an ultrasonic wave applied for the wiring bonding are never buffered by the adhesive double tape 36. Namely, since the heat and/or the ultrasonic wave applied for the wiring bonding is efficiently conducted or transferred, the bonding wire is bonded to the upper surface of the inner lead with a satisfactory bonding property.

Figure 5A:
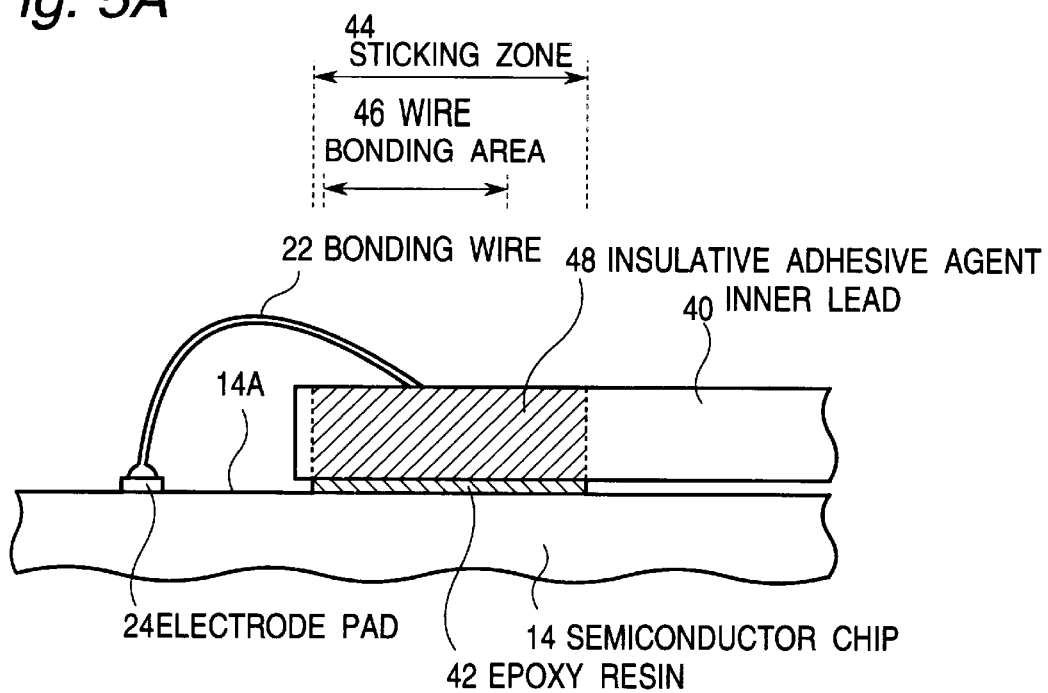
FIG. 5A is a view similar to that of FIG. 3A, but showing a second embodiment of the LOC structure semiconductor device in accordance with the present invention.
Figure 5B:
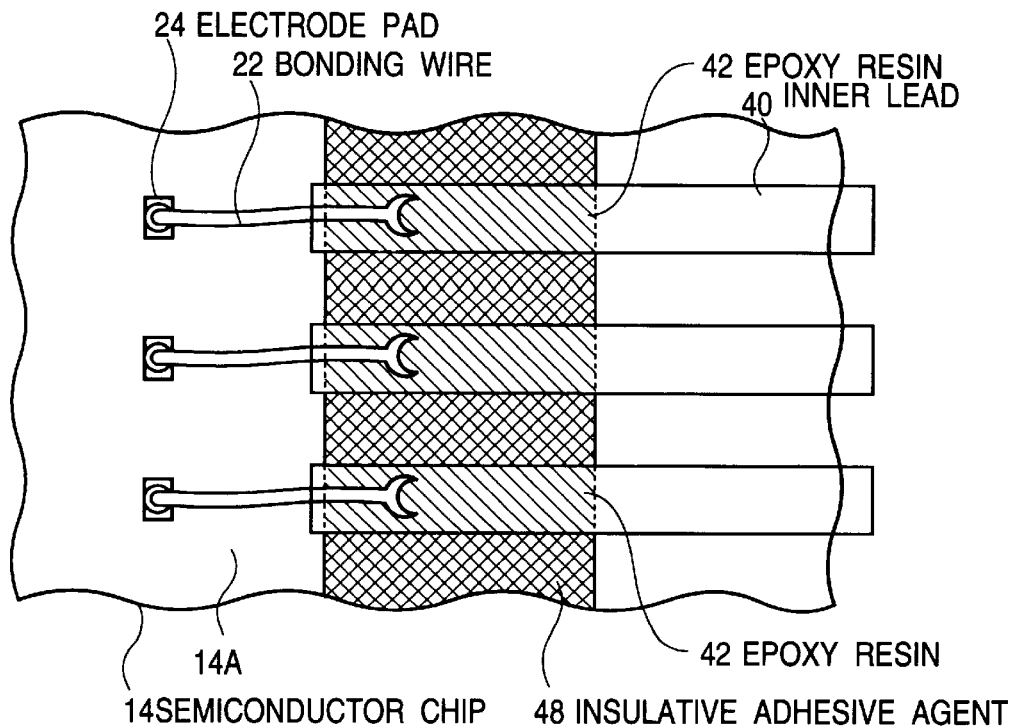
FIG. 5B is a view similar to that of FIG. 3B, but showing the second embodiment of the LOC structure semiconductor device in accordance with the present invention shown in FIG. 5A.

Referring to FIG. 5A, there is shown an enlarged diagrammatic partial sectional view of a second embodiment of the LOC structure semiconductor device in accordance with the present invention, for showing how an inner lead is stuck to a semiconductor chip. FIG. 5B is an enlarged diagrammatic partial plan view of the LOC structure semiconductor device shown in FIG. 5A, showing a portion corresponding to a portion shown in FIG. 5A. In these figures, elements corresponding to those shown in FIGS. 3A and 3B are given the same Reference Numerals.

The shown second embodiment of the LOC structure semiconductor device in accordance with the present invention, comprises a semiconductor chip 14, a plurality of inner leads 40 mounted on a principal surface 14A of the semiconductor chip 14, and a thin epoxy resin layer 42 on the principal surface 14A of the semiconductor chip 14, in a sticking zone 44 including a wiring bonding area 46, for sticking a lower surface of the inner leads 40 to the principal surface 14A of the semiconductor chip 14 in the sticking zone 44. The thin epoxy resin layer 42 extends over the principal surface 14A of the semiconductor chip 14 across the inner leads 40 in a direction perpendicular to the inner lead so that the epoxy resin layer 42 exists not only under each inner lead 40 but also exists on the principal surface 14A of the semiconductor chip 14 between each pair of adjacent inner leads 40.

The second embodiment also comprises an insulative adhesive agent 48 filled in a space between each pair of adjacent inner leads 40, and a plurality of bonding wires 22 each having one end connected to a corresponding electrode pad 24 on the principal surface 14A of the semiconductor chip 14 by a wiring bonding technology and the other end connected to an upper surface of a corresponding inner lead 40 within the wire bonding area 46 also by the wiring bonding technology.

The above mentioned semiconductor device can be formed as follows: The insulative adhesive agent 48 is previously filled in the space between each pair of adjacent inner leads 40 of a lead frame in the sticking zone 44, and is then solidified to fix the inner leads relative to one another in the lead frame. Thereafter, in the sticking zone 44, the epoxy resin layer 42 is coated over a lower surface of the inner leads and a lower surface of the insulative adhesive agent 48 filled in the space between each pair of adjacent inner leads 40. Therefore, the epoxy resin layer 42 has only a function of sticking the inner leads to the semiconductor chip, but does not have a function of fuixig the inner leads relative to one another in the lead frame before the inner leads are stuck to the semiconductor chip. Thereafter, the lead frame thus prepared is stuck on the principal surface 14A of the semiconductor chip 14 in such a manner that the epoxy resin layer 42 is stuck on the principal surface 14A of the semniconductor chip 14.

In the above mentioned embodiment, the epoxy resin layer 42 is provided under each inner lead 40 within the wire bonding area 46. However, since the epoxy resin layer 42 only a function of sticking the inner leads to the semiconductor chip, the epoxy resin layer 42 has a necessary degree of adhesive property with an extremely thin thickness in comparison with the adhesive tape 16 of the prior art example and the adhesive tape 36 of the first embodimiuent, and in addition, the epoxy resin layer 42 has a modulus of elasticity sufficiently lower than the polyimide double coated tape, with the result that when the bonding wire 22 is bonded to an upper surface of the inner lead 40 in the wire bonding area 46, a heat and/or an ultrasonic wave applied for the wiring bonding are almost never buffered by the epoxy resin layer 42. Namely, since the heat and/or the ultrasonic wave applied for the wiring bonding is efficiently conducted or transferred with no substantial loss, the bonding wire is bonded to the upper surface of the inner lead with a satisfactory bonding property. Therefore, the epoxy resin layer 42 can be replaced with an extremely thin layer of another material which can stick the inner leads to the semiconductor chip and which can transmit a wire bonding energy without a substantial loss.

This second embodiment is inferior to the first embodiment in the wire bonding property to some extend, but is superior to the first embodiment in that it is not necessary to form the recess 32 in each inner lead.

As mentioned above, in the first embodiment of the LOC structure semiconductor device in accordance with the present invention, the inner lead is in direct contact with the principal surface of the semiconductor chip in the wire bonding area, and in the second embodiment of the LOC structure semiconductor device in accordance with the present invention, the inner lead is bonded on the principal surface of the semiconductor chip in the wire bonding area, through only an extremely thin layer such as an extremely thin epoxy resin layer of transmitting a wire bonding energy without a substantial loss- Therefore, in both the embodiments mentioned above, since there is no thick adhesive double coated tape which was provided, in the prior art, between the lower surface of the inner lead and the principal surface of the semiconductor chip in the wire bonding area to act as a buffer member which absorbs the bonding energy such as the heat and/or the ultrasonic wave for the wiring bonding and/or which impedes transmission of the bonding energy for the wiring bonding, the bonding energy such as the heat and/or the ultrasonic wave applied for the wiring bonding is efficiently conducted or transferred with no substantial loss, with the result that the bonding wire is bonded to the upper surface of the inner lead with a satisfactory elevated bonding property.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor device of a lead-on-chip structure, comprising:

a semiconductor chip having a principal surface and a plurality of electrode pads, provided on said principal surface;

a plurality of inner leads having a lower surface in direct contact with said principal surface of said semiconductor chip in a wiring bonding region, said lower surface of each inner lead having a recess formed at a place different from said wiring bonding region;

an adhesive double coated tape accommodated in said recess of each inner lead having an upper surface stuck to a bottom of said recess of each inner lead and a lower surface stuck to said principal surface of said semiconductor chip, for sticking said inner leads to said principal surface of said semiconductor chip; and a plurality of bonding wires each having one end connected to a corresponding electrode pad on said principal surface of said semiconductor chip and the other end connected to an upper surface of a corresponding inner lead within said wire bonding area.

2. A semiconductor device claimed in claim 1 wherein said recess of each inner lead has a depth substantially corresponding to a half of a thickness of said inner lead.

3. A semiconductor device claimed in claim 1 wherein said recess of each inner lead has a depth substantially corresponding to a thickness of said adhesive double coated tape.

4. A semiconductor device claimed in claim 1 wherein said adhesive double coated tape extends across each of said inner leads in a direction perpendicular to said inner lead so that said adhesive double coated tape is not only accommodated in said recess of each inner lead but also exists on said principal surface of said semiconductor chip between each pair of adjacent inner leads.

5. A semiconductor device of a lead-on-chip structure, comprising:

a semiconductor chip having a principal surface and a plurality of electrode pads provided on said principal surface;

a plurality of inner leads having a lower surface stuck on said principal surface of said semiconductor chip in at least a wiring bonding region through an extremely thin layer which is stuck to said lower surface of each inner lead and said principal surface of said semiconductor chip and which transmits a bonding energy for a wiring bonding with no substantial loss;

an insulative adhesive agent filled in a space on said principal surface of said semiconductor chip between each pair of adjacent inner lead at a level above said thin layer and extending to a level approximately coplanar with an upper surface of said inner leads; and a plurality of bonding wires each having one end connected to a corresponding electrode pad on said principal surface of said semiconductor chip and the other end connected to an upper surface of a corresponding inner lead within said wire bonding area.

6. A semiconductor device claimed in claim 5 wherein said extremely thin layer is formed of epoxy resin.

7. A semiconductor device of a lead-on-chip structure, comprising:

a semiconductor chip having a principal surface and a plurality of electrode pads provided on said principal surface;

a plurality of inner leads having a lower surface stuck on said principal surface of said semiconductor chip in at least a wiring bonding region through an extremely thin layer which is stuck to said lower surface of each inner lead and said principal surface of said semiconductor chip and which transmits a bonding energy for a wiring bonding with no substantial loss;

an insulative adhesive agent filled in a space on said principal surface of said semiconductor chip between each pair of adjacent inner leads and approximately co-planar with an upper surface of said inner leads; and a plurality of bonding wires each having one end connected to a corresponding electrode pad on said principal surface of said semiconductor chip and the other end connected to an upper surface of a corresponding inner lead within said wire bonding area, wherein said extremely thin layer extends on said principal surface of said semiconductor chip across said inner lead in a direction perpendicular to said inner lead so that said extremely thin layer exists not only under each inner lead but also exists on said principal surface of said semiconductor chip between each pair of adjacent inner leads.

* * * * *